(12) United States Patent
Otremba et al.

(10) Patent No.: US 9,595,487 B2
(45) Date of Patent: Mar. 14, 2017

(54) CIRCUIT ARRANGEMENT AND METHOD FOR MANUFACTURING THE SAME

(71) Applicant: Infineon Technologies AG, Neubiberg (DE)

(72) Inventors: Ralf Otremba, Kaufbeuren (DE); Klaus Schiess, Allensbach (DE); Anton Mauder, Kolbermoor (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 393 days.

(21) Appl. No.: 13/925,900

(22) Filed: Jun. 25, 2013

(65) Prior Publication Data

US 2014/0374913 A1 Dec. 25, 2014

(51) Int. Cl.
| | |
|---|---|
| H01L 23/367 | (2006.01) |
| H01L 23/31 | (2006.01) |
| H01L 23/40 | (2006.01) |
| H01L 23/495 | (2006.01) |
| H05K 1/02 | (2006.01) |
| H05K 3/34 | (2006.01) |

(52) U.S. Cl.
CPC ....... *H01L 23/3675* (2013.01); *H05K 1/0265* (2013.01); *H01L 23/3107* (2013.01); *H01L 23/4006* (2013.01); *H01L 23/4093* (2013.01); *H01L 23/49562* (2013.01); *H01L 2224/06181* (2013.01); *H01L 2924/1301* (2013.01); *H01L 2924/1305* (2013.01); *H01L 2924/13055* (2013.01); *H01L 2924/13062* (2013.01); *H01L 2924/13091* (2013.01); *H01L 2924/1431* (2013.01); *H05K 1/0203* (2013.01); *H05K 1/0287* (2013.01); *H05K 3/3447* (2013.01); *H05K 2201/066* (2013.01); *H05K 2201/09227* (2013.01)

(58) Field of Classification Search
CPC . H01L 2924/1431; H01L 25/18; H01L 25/50; H01L 23/3675; H01L 2924/13091; H01L 23/4093; H01L 2224/06181; H01L 2924/13062; H01L 2924/13055; H01L 23/3107; H01L 23/4006; H01L 23/49562
See application file for complete search history.

(56) References Cited

U.S. PATENT DOCUMENTS

2006/0180932 A1   8/2006   Otremba et al.
2006/0226819 A1*   10/2006   Xu et al. ........................ 323/268

(Continued)

FOREIGN PATENT DOCUMENTS

| CN | 102054830 A | 5/2011 |
|---|---|---|
| DE | 102005001151 B4 | 4/2012 |

*Primary Examiner* — Eva Y Montalvo
*Assistant Examiner* — Victor Barzykin

(57) ABSTRACT

Various embodiments may provide a circuit arrangement. The circuit arrangement may include a carrier having at least one electrically conductive line; a plurality of discrete encapsulated integrated circuits arranged on the carrier; wherein a first integrated circuit of the plurality of integrated circuits is in electrical contact with a second integrated circuit of the plurality of integrated circuits to form a first current path bypassing the carrier; and wherein the first integrated circuit of the plurality of integrated circuits is in electrical contact with the second integrated circuit of the plurality of integrated circuits to form a second current path via the at least one electrically conductive line.

22 Claims, 9 Drawing Sheets

(56) References Cited

U.S. PATENT DOCUMENTS

| | | | |
|---|---|---|---|
| 2007/0278669 A1* | 12/2007 | Hierholzer et al. | 257/718 |
| 2008/0197463 A1* | 8/2008 | Otremba | H01L 23/49524 |
| | | | 257/676 |
| 2010/0001291 A1* | 1/2010 | Otremba et al. | 257/77 |
| 2011/0075451 A1* | 3/2011 | Bayerer et al. | 363/37 |
| 2013/0222045 A1* | 8/2013 | Wu | H01L 23/12 |
| | | | 327/419 |
| 2013/0313696 A1* | 11/2013 | Hsieh et al. | 257/675 |

* cited by examiner

CIRCUIT ARRANGEMENT AND METHOD FOR MANUFACTURING THE SAME

TECHNICAL FIELD

Various embodiments relate generally to a circuit arrangement and a method for manufacturing a circuit arrangement.

BACKGROUND

Integrated circuit chips, such as power semiconductor chips, may be integrated into an electronic package, e.g. a through-hole-package (THP) or a surface-mounted-device (SMD). Discrete through-hole-packages, such as TO (Transistor Outline) packages, e.g., TO218, TO220, TO247, TO251, can be used for discrete integrated circuit chips.

Various discrete integrated circuit chips may be used to form various circuitry, such as a cascode circuit or a half bridge circuit. A plurality of integrated circuit chips may be arranged to form a cascode-like circuit arrangement. The cascode-like circuit arrangement is usually implemented by means of discrete chip mounting and/or multi-chip mounting in respective applications (e.g. AC/DC converter and/or DC/DC converter). For this purpose, a high number of designs may be considered, which may, however, not be optimized for the task of modular design and short power path with respect to cost-performance

SUMMARY

Various embodiments may provide a circuit arrangement. The circuit arrangement may include a carrier having at least one electrically conductive line; a plurality of discrete encapsulated integrated circuits arranged on the carrier; wherein a first integrated circuit of the plurality of integrated circuits is in electrical contact with a second integrated circuit of the plurality of integrated circuits to form a first current path bypassing the carrier; and wherein the first integrated circuit of the plurality of integrated circuits is in electrical contact with the second integrated circuit of the plurality of integrated circuits to form a second current path via the at least one electrically conductive line.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DESCRIPTION

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

Figure 1A:
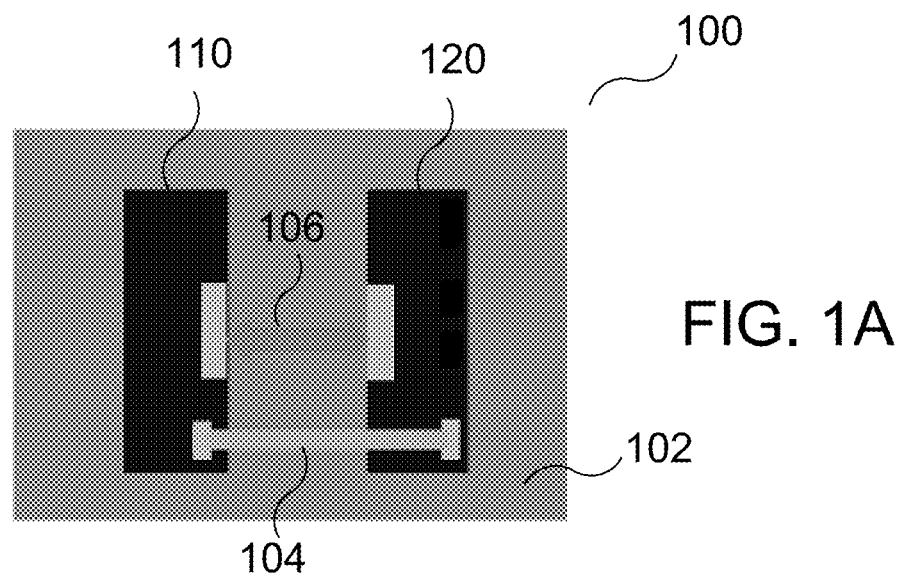
FIG. 1A shows a bottom view of a circuit arrangement according to various embodiments.
Figure 1B:
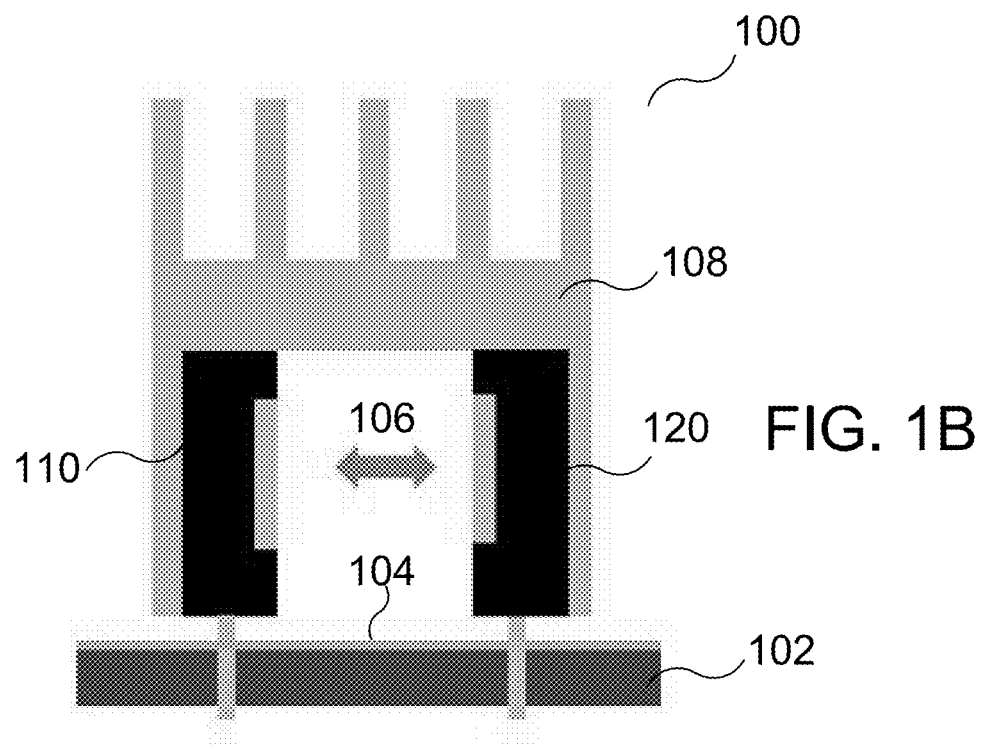
FIG. 1B shows a side view of the circuit arrangement according to various embodiments.

FIG. 1A shows a bottom view of a circuit arrangement 100 according to various embodiments, and FIG. 1B shows a side view of the circuit arrangement 100 according to various embodiments.

The circuit arrangement 100 may include a carrier 102 having at least one electrically conductive line 104; and a plurality of discrete encapsulated integrated circuits 110, 120 arranged on the carrier 102. Though FIG. 1A shows two discrete encapsulated integrated circuits 110, 120, more than two discrete encapsulated integrated circuits may be included in the circuit arrangement 100 in accordance with various embodiments.

A first integrated circuit 110 of the plurality of integrated circuits may be in electrical contact with a second integrated circuit 120 of the plurality of integrated circuits to form a first current path bypassing the carrier 102. In FIG. 1A which is a view from the bottom through the carrier 102, the arrow 106 indicates the existence of the first current path there between but may not represent the actual current path. In various embodiments, the electrical contact between the first integrated circuit 110 and the second integrated circuit 120 may be implemented by means of a redistribution layer (not shown) external from the carrier 102 along with respective interconnects from the redistribution layer to the respective integrated circuit 110, 120. As shown in FIG. 1B, the first current path denoted by 106 is bypassing the carrier 102.

The first integrated circuit 110 of the plurality of integrated circuits may also be in electrical contact with the second integrated circuit 120 of the plurality of integrated circuits to form a second current path via the at least one electrically conductive line 104 of the carrier 102.

In various embodiments, the carrier 102 may be a printed circuit board. In various embodiments, the carrier 102 may include an organic substrate, e.g., including laminate material or epoxy. In various embodiments, the carrier 102 may include an inorganic substrate, e.g. including ceramic material.

The discrete encapsulated integrated circuits 110, 120 may be configured as TO (Transistor Outline) integrated circuits, or may be configured as SMD (Surface-Mounted-Device) integrated circuits.

In various embodiments, the plurality of integrated circuits 110, 120 may include one or more power integrated circuits. The one or more power integrated circuits may include at least one of a power integrated circuit selected from a group including or consisting of: power FET (field effect transistor, such as power MOSFET (Metal Oxide Semiconductor Field Effect Transistor) or JFET (Junction Gate Field Effect Transistor)); power bipolar transistor; IGBT (Insulated Gate Bipolar Transistor); and thyristor. The one or more power integrated circuits may include a power FET integrated with additional logic and/or sensor components using BCD (Bipolar-CMOS-DMOS) technology or CD (CMOS-DMOS) technology.

In various embodiments, the discrete encapsulated integrated circuit 110, 120 may internally have a planar structured chip in which a current may flow horizontally parallel to the main surface of the chip. In various embodiments, the discrete encapsulated integrated circuit 110, 120 may internally have a vertical structured chip in which a current may flow vertically through the chip from one main surface to the opposite other main surface of the chip. In other words, the current can flow in a direction perpendicular to the main surfaces of the chip. The chip having a vertical structure may have contacts on its front side and back side. By way of example, the drain contact of a power MOSFET chip may be arranged on the first side of the chip, while the gate contact and the source contact of the power MOSFET chip may be arranged on the second side of the chip so as to support a vertical current flow through the chip between the drain region over the first chip side and the source region over the second chip side. The chip may be encapsulated with encapsulation material, such as mold material (e.g. press mold material) and lamination material (e.g. polymer material with glass fibers), to form the respective discrete encapsulated integrated circuit.

In various embodiments, the discrete encapsulated integrated circuits 110, 120 may be individually tested, e.g. before being arranged on the carrier 102, so as to achieve a higher yield.

According to various embodiments, the first current path may be electrically insulated from the second current path. By way of example, the redistribution layer through which the first current path is formed may be electrically insulated from the electrically conductive line 104 of the carrier 102 through which the second current path is formed.

According to various embodiments, the plurality of integrated circuits 110, 120 may be configured to provide the first current path to be capable of carrying a first current being higher than a second current flowing through the second current path. The plurality of integrated circuits may be configured to provide the first current path to be capable of carrying a load current (e.g. higher than 10 A, e.g. in the range from about 10 A to about 1000 A) and to provide the second current path to be capable of carrying a control current (e.g. lower than 1 A, e.g. in the range from about 5 mA to about 5 A).

According to various embodiments, the plurality of integrated circuits 110, 120 may include at least one normally-on device, e.g. a depletion MOS transistor. In various embodiments, the plurality of integrated circuits 110, 120 may include at least one normally-off device, e.g. an enhancement MOS transistor. The normally-off device may be a discrete encapsulated device.

According to various embodiments, the circuit arrangement 100 may further include a cooling structure 108 thermally coupled to at least one of the integrated circuits 110, 120. The cooling structure 108 may be a heat sink, for example. In various embodiments, the cooling structure 108 may be mechanically coupled to the plurality of integrated circuits. In various embodiments, the cooling structure 108 may be mechanically coupled to the plurality of integrated circuits by means of one of the following: clamping structure; screw; soldering; glueing; welding.

Figure 2A:
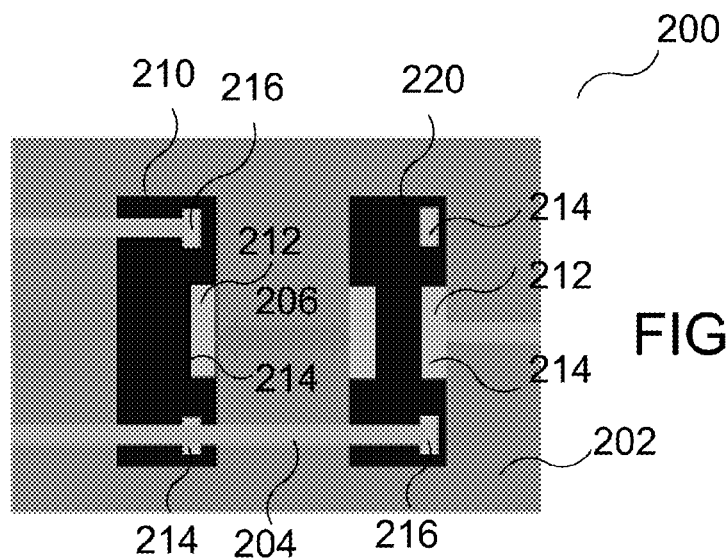
FIG. 2A shows a bottom view of a circuit arrangement according to various embodiments.
Figure 2B:
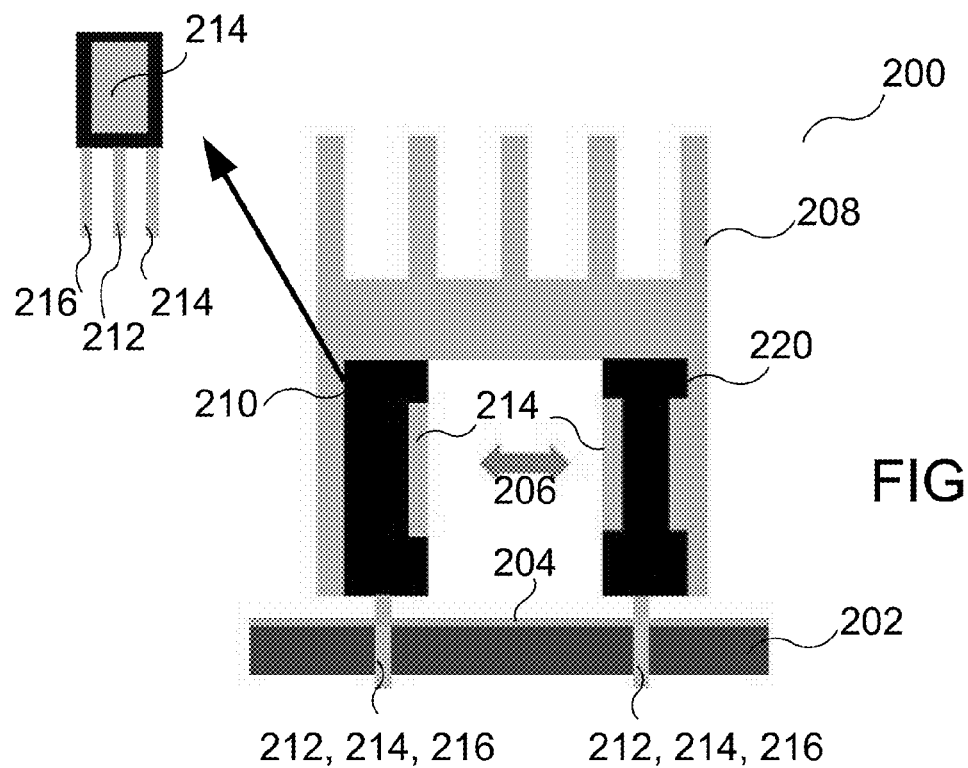
FIG. 2B shows a side view of the circuit arrangement according to various embodiments.

FIG. 2A shows a bottom view of a circuit arrangement 200 according to various embodiments, and FIG. 2B shows a side view of the circuit arrangement 200 according to various embodiments.

Similar to the circuit arrangement 100 described above, the circuit arrangement 200 may include a carrier 202 having at least one electrically conductive line 204; and a plurality of discrete encapsulated integrated circuits 210, 220 arranged on the carrier 202. Various embodiments described with regard to the circuit arrangement 100 above are analogously valid for the circuit arrangement 200, and vice versa.

In various embodiments of FIGS. 2A and 2B, each integrated circuit 210, 220 may include a first controlled terminal 212, a second controlled terminal 214 and a control terminal 216. A first controlled terminal 212 of a first integrated circuit 210 of the plurality of integrated circuits may be in electrical contact with at least one terminal of a second integrated circuit 220 of the plurality of integrated circuits to form a current path bypassing the carrier. In FIG. 2A which is a view from the bottom through the carrier 202, the arrow 206 indicates the existence of the current path between the first integrated circuit 210 and the second integrated circuit 220, but may not represent the actual current path. In various embodiments, the electrical contact between the first controlled terminal 212 of the first integrated circuit 210 and at least one terminal of the second integrated circuit 220 may be achieved through a redistribution layer (not shown) external from the carrier 202 along with respective interconnects from the redistribution layer to the respective integrated circuit 210, 220. As shown in FIG. 2B, the current path denoted by 206 is bypassing the carrier 202.

A control terminal 216 of the second integrated circuit 220 may be electrically coupled to a terminal of the first integrated circuit 210 via the at least one electrically conductive line 204.

A first controlled terminal 212 of each integrated circuit 210, 220 may be arranged on a first side of the integrated circuit, and a second controlled terminal 214 of each integrated circuit may be arranged on a second side of the integrated circuit, wherein the second side is opposite the first side.

In FIG. 2B, a front view of the first discrete encapsulated integrated circuit 210 is shown, which includes the first controlled terminal 212, the second controlled terminal 214 and the control terminal 216 arranged as a plurality of pins extending from the encapsulated body. The first discrete encapsulated integrated circuit 210 may further include the first controlled terminal 212 and/or the second controlled terminal 214 as a clip exposed at the side of the encapsulated body. In the embodiments wherein the second controlled terminal 214 is provided as the clip exposed at the side of the encapsulated body, the first controlled terminal 212 and the second controlled terminal clip 214 may at least partially coincide with each other in the bottom view through the carrier 202 in FIG. 2A. The first discrete encapsulated integrated circuit 210 may be configured as a TO (Transistor Outline) package, e.g. a TO220-3 or TO247-3 package.

In various embodiments, the at least one terminal of the second integrated circuit 220 in electrical contact with the first controlled terminal 212 of the first integrated circuit 210 may be a first controlled terminal 212 or a second controlled terminal 214 of a second integrated circuit 220.

In various embodiments, the first controlled terminal 212 of the first integrated circuit 210 may be of the same terminal type as the at least one terminal of the second integrated circuit 220 in electrical contact with the first controlled terminal 212 of the first integrated circuit 210. The first controlled terminal 212 of the first integrated circuit 210 and the at least one terminal 214 of the second integrated circuit 220 may be drain terminals of field effect transistors, e.g. to form a bi-directional switch for blocking in both directions.

The first controlled terminal 212 of the first integrated circuit 210 may be of a different terminal type as the at least one terminal of the second integrated circuit 220. The first controlled terminal 212 of the first integrated circuit may be a drain terminal of a field effect transistor and the at least one terminal 214 of the second integrated circuit may be a source terminal of a field effect transistor, e.g. to form a cascade circuit or a half-bridge circuit.

The current path between the integrated circuits 210, 220 will be described in more detail with reference to FIGS. 3A and 3B below.

As shown in FIG. 2B, the circuit arrangement 200 may further include a cooling structure 208 thermally coupled to at least one of the integrated circuits 210, 220. The cooling structure 208 may be mechanically coupled to the plurality of integrated circuits 210, 220, for example, by means of one of clamping structure, screw, soldering, glueing and welding.

Figure 3A:
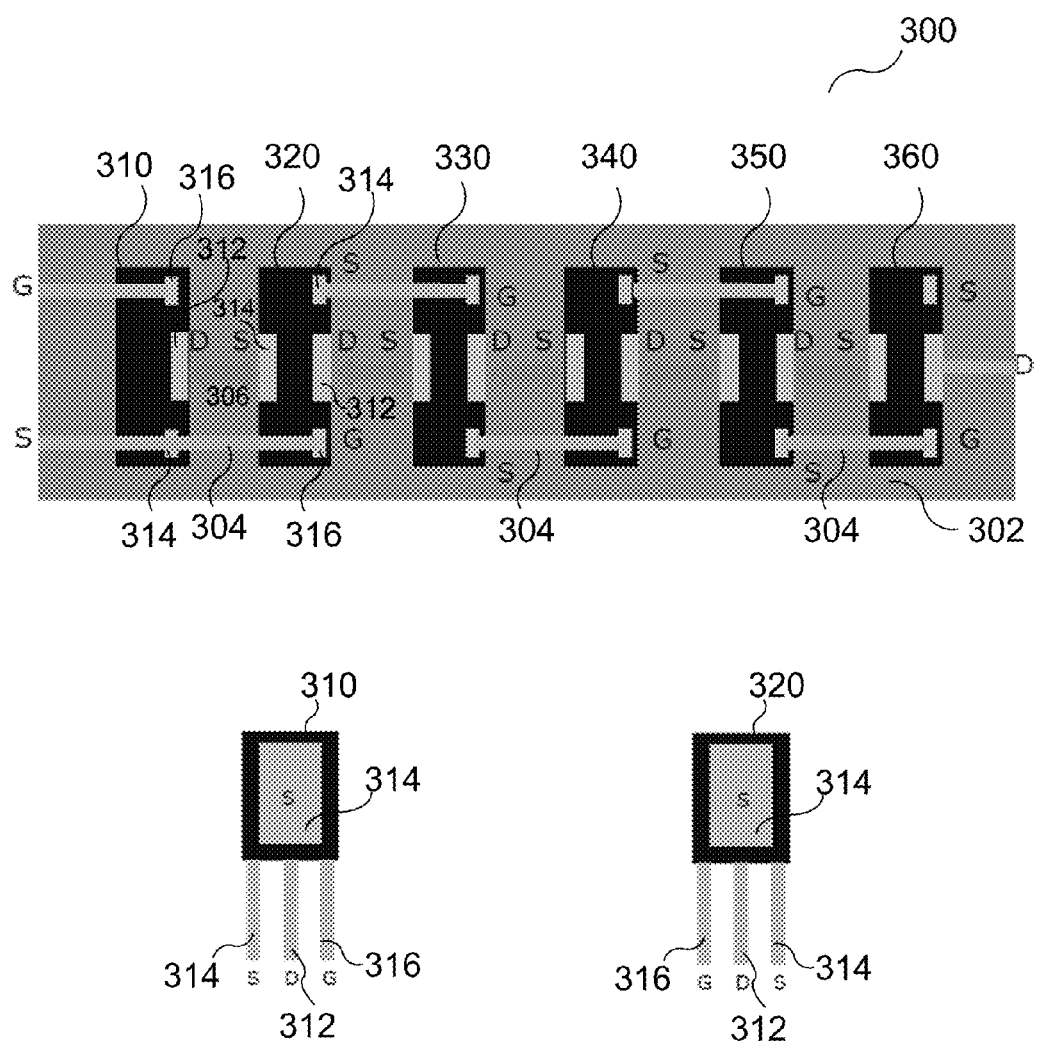
FIG. 3A shows a bottom view of a circuit arrangement according to various embodiments.
Figure 3B:
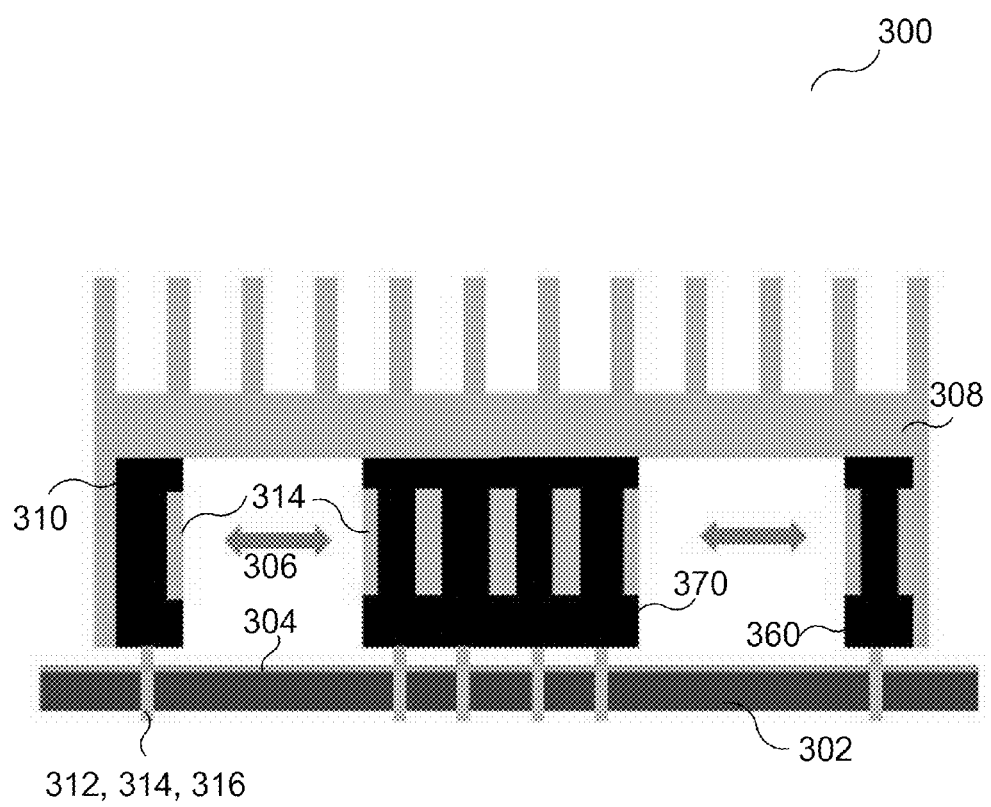
FIG. 3B shows a side view of the circuit arrangement according to various embodiments.

FIG. 3A shows a bottom view of a circuit arrangement 300 according to various embodiments, and FIG. 3B shows a side view of the circuit arrangement 300 according to various embodiments.

Similar to the circuit arrangements 100, 200 described above, the circuit arrangement 300 may include a carrier 302 having at least one electrically conductive line 304; and a plurality of discrete encapsulated integrated circuits 310, 320, 330, 340, 350 arranged on the carrier 302. In the embodiments shown in FIGS. 3A and 3B, more than two integrated circuits are shown. Various embodiments described with regard to the circuit arrangements 100, 200 above are analogously valid for the circuit arrangement 300, and vice versa.

In various embodiments of FIGS. 3A and 3B, each integrated circuit 310-350 may include a first controlled terminal 312, a second controlled terminal 314 and a control terminal 316. For illustrative purpose, the plurality of integrated circuits 310-350 are shown to be power FETs, e.g. power MOSFETs, wherein the first controlled terminal 312 may be a drain terminal (D), the second controlled terminal 314 may be a source terminal (S) and the control terminal 316 may be a gate terminal (G). It is understood that the plurality of integrated circuits 310-350 may be other types of power integrated circuits, and the respective terminals of the integrated circuits and the electrical contact/coupling there between described below may be adapted accordingly.

In various embodiments, the first controlled terminal 312, e.g. the drain terminal, of a first integrated circuit 310 of the plurality of integrated circuits may be in electrical contact with at least one terminal (e.g. the source terminal 314) of a second integrated circuit 320 of the plurality of integrated circuits to form a first current path bypassing the carrier 302. In FIG. 3A which is a view from the bottom through the carrier 302, the arrow 306 indicates the existence of the first current path between the first integrated circuit 310 and the second integrated circuit 320, which may be achieved through a redistribution layer (not shown) external from the carrier 302 along with respective interconnects from the redistribution layer to the drain terminal 312 of the first integrated circuit 310 and the source terminal 314 of the second integrated circuit 320. Accordingly, the first controlled terminal 312 of the first integrated circuit 310 may be of a different terminal type as the at least one terminal 314 of the second integrated circuit 320, e.g. to form a cascade circuit or a half-bridge circuit.

In various embodiments not shown in FIG. 3A, the first controlled terminal 312 of the first integrated circuit 310 may be of the same terminal type as the at least one terminal of the second integrated circuit 320 in electrical contact with the first controlled terminal 312 of the first integrated circuit 310. By way of example, the first controlled terminal 312 of the first integrated circuit 310 and the at least one terminal 314 of the second integrated circuit 320 may be drain terminals of field effect transistors, e.g. to form a bi-directional switch for blocking in both directions.

The control terminal 316, e.g. the gate terminal, of the second integrated circuit 320 may be electrically coupled to a terminal, e.g. the source terminal 314 of the first integrated circuit 310 via the at least one electrically conductive line 304, so as to form a second current path.

In FIG. 3A, a front view of the first and the second discrete encapsulated integrated circuits 310, 320 is shown, each of which includes the first controlled terminal (D) 312, the second controlled terminal (S) 314 and the control terminal (G) 316 arranged as a plurality of pins extending from the encapsulated package body (e.g. TO package, e.g. TO220-3 or TO247-3 package). In various embodiments, the first and the second discrete encapsulated integrated circuit 310, 320 may further include the first controlled terminal 312 and/or the second controlled terminal 314 as a clip exposed at the side of the encapsulated body. In the embodiments of FIG. 3A, the clip exposed at the side of the encapsulated body is shown to be the source terminal 314 of the first and/or the second discrete encapsulated integrated circuit 310, 320. In various embodiments not shown in FIG. 3A, the clip exposed at the side of the encapsulated body may also be the drain terminal 312 of the first and/or the second discrete encapsulated integrated circuit 310, 320. The discrete encapsulated integrated circuits 330, 340, 350 may have the similar structure as the first and the second discrete encapsulated integrated circuits 310, 320.

In various embodiments, each discrete encapsulated integrated circuit may internally has its first controlled terminal 312 arranged on a first side of the integrated circuit and its second controlled terminal 314 arranged on a second side of the integrated circuit, wherein the second side is opposite the first side.

The integrated circuits 330, 340, 350 may be similarly connected among themselves and to the second integrated circuit 320 in a similar way as the electrical connection between the first integrated circuit 310 and the second integrated circuit 320, such that between each pair of electrically connected integrated circuits a first current path is formed bypassing the carrier 302 and a second current path is formed via the carrier 302.

In various embodiments, the circuit arrangement 300 may further include at least one further discrete encapsulated integrated circuit 360 being arranged at a distance to the plurality of integrated circuits 310-350 and being electrically coupled to the plurality of integrated circuits 310-350 via the carrier 302. The at least one further discrete encapsulated integrated circuit 360 may include a logic circuit, a sensor circuit, or a power transistor, or the same integrated circuit as the integrated circuits 310-350.

In various embodiments, the further discrete encapsulated integrated circuit 360 may be electrically coupled to the integrated circuit 350 in a similar way as the electrical connection between the first integrated circuit 310 and the second integrated circuit 320, such that a first current path is formed bypassing the carrier 302 and a second current path is formed via the carrier 302.

The first current path provided among the integrated circuits 310-360 may be capable of carrying a first current being higher than a second current flowing through the second current path. In various embodiments, the first current path among the integrated circuits 310-360 may be capable of carrying a load current (e.g. higher than 10 A), e.g. a load current between the drain terminal of the first integrated circuit and the source terminal of the second integrated circuit. In various embodiments, the second current path among the integrated circuits 310-360 may be capable of carrying a control current (e.g. lower than 1 A), e.g. a control current between the source terminal of the first integrated circuit and the gate terminal of the second integrated circuit.

In various embodiments, the plurality of integrated circuits 310-360 may be configured to provide the first current path to be capable of carrying the first current being in the range from about 10 A to about 1000 A, e.g. in the range from about 20 A to about 900 A, e.g. in the range from about 50 A to about 800 A, e.g. in the range from about 80 A to about 600 A, e.g. in the range from about 100 A to 400 A, e.g. in the range from about 200 A to 300 A.

In various embodiments, the plurality of integrated circuits 310-360 may be configured to provide the second current path to be capable of carrying the second current being in the range from about 5 mA to about 5 A, e.g. in the range from about 10 mA to about 4 A, e.g. in the range from about 50 mA to about 3 A, e.g. in the range from about 100 mA to about 2 A, e.g. in the range from about 500 mA to about 1 A.

Figure 4:
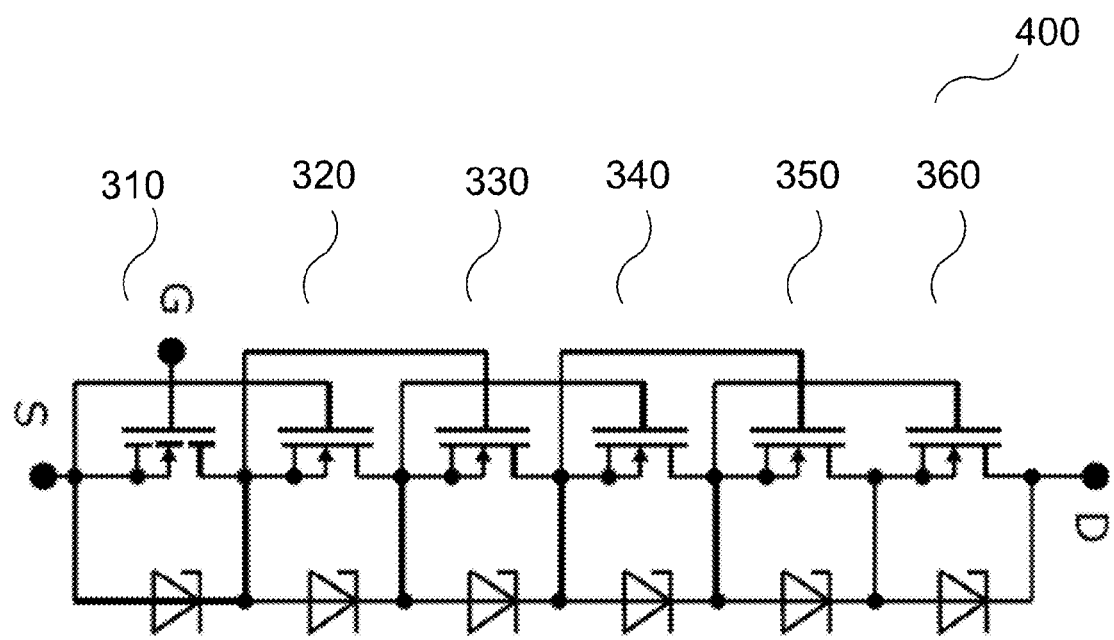
FIG. 4 shows a circuit diagram corresponding to the circuit arrangement of FIG. 3A.

The circuit arrangement 300 of FIG. 3A may thus form the circuit 400 as shown in FIG. 4.

In various embodiments, the circuit 400 may a cascade-like circuit formed by the plurality of integrated circuits 310-350 and the further integrated circuit 360 of the circuit arrangement 300. In various embodiments, the first integrated circuit 310 may be a normally-off device, such as an enhancement MOS component, and the integrated circuits 320-360 may be normally-on devices, such as depletion MOS components. Depending on the requirement with respect to the electrical strength, an arbitrary number (e.g. 5 to 10) of depletion MOS components may be included in the circuit arrangement 300, wherein the total electric strength results from the sum of the individual electric strength.

In various embodiments, the entire circuit 400 of FIG. 4 does not have to be included in the circuit arrangement 300. For example, only part of the circuit 400 of FIG. 4 may be included in the circuit arrangement 300.

In various embodiments shown in FIG. 3B, the first integrate circuit 310, e.g. a normally-off transistor, may be a discrete device. The integrated circuits 320-350 may be further integrated in a single device/module 370. Each of the integrated circuits 320-350 may have a similar structure as the integrated circuits 310, 320 shown in FIG. 3A, having a plurality of pins at the bottom of the encapsulated body and a clip exposed at the side of the encapsulated body. In various embodiments, each of the integrated circuits 320-350 may have a source terminal clip at one side surface and a drain terminal clip at the opposite side surface of the encapsulated body, such that a drain terminal clip of the preceding integrated circuit is facing and in contact with a source terminal clip of the succeeding integrated circuit to form the first current path there between.

In various embodiments, the integrated circuits 320-350 may also be discrete devices, as shown in FIG. 3A. Each of the integrated circuits 320-350 may have a plurality of pins at the bottom of the encapsulated body and one or more clips exposed at the side of the encapsulated body. In various embodiments, each of the integrated circuits 320-350 may have a source terminal clip at one side surface and a drain terminal clip at the opposite side surface of the encapsulated body, such that a drain terminal clip of the preceding integrated circuit is facing a source terminal clip of the succeeding integrated circuit and the first current path may be formed by interconnection there between.

As shown in FIG. 3B, the circuit arrangement 300 may further include a cooling structure 308 thermally coupled to at least one of the integrated circuits 310-360 similar to the circuit arrangements 100, 200.

Various embodiments above provide a package board module, wherein the desired power path between source and drain may be provided via an additional redistribution level external from the board (e.g. the carrier). The two power electrodes (source and drain) for each sub module (e.g. TO220-3 or TO247-3 for the respective discrete encapsulated integrated circuit) may also be coupled to the carrier in order to form the desired cascade-like coupling as show in FIG. 4.

The embodiments above show the circuit arrangement to form a cascade circuit. It is understood that the electrical coupling between the terminals of the respective discrete encapsulated integrated circuits may be arranged differently in order to form other types of circuit, such as a half-bridge circuit or a bi-directional switch.

Figure 5:
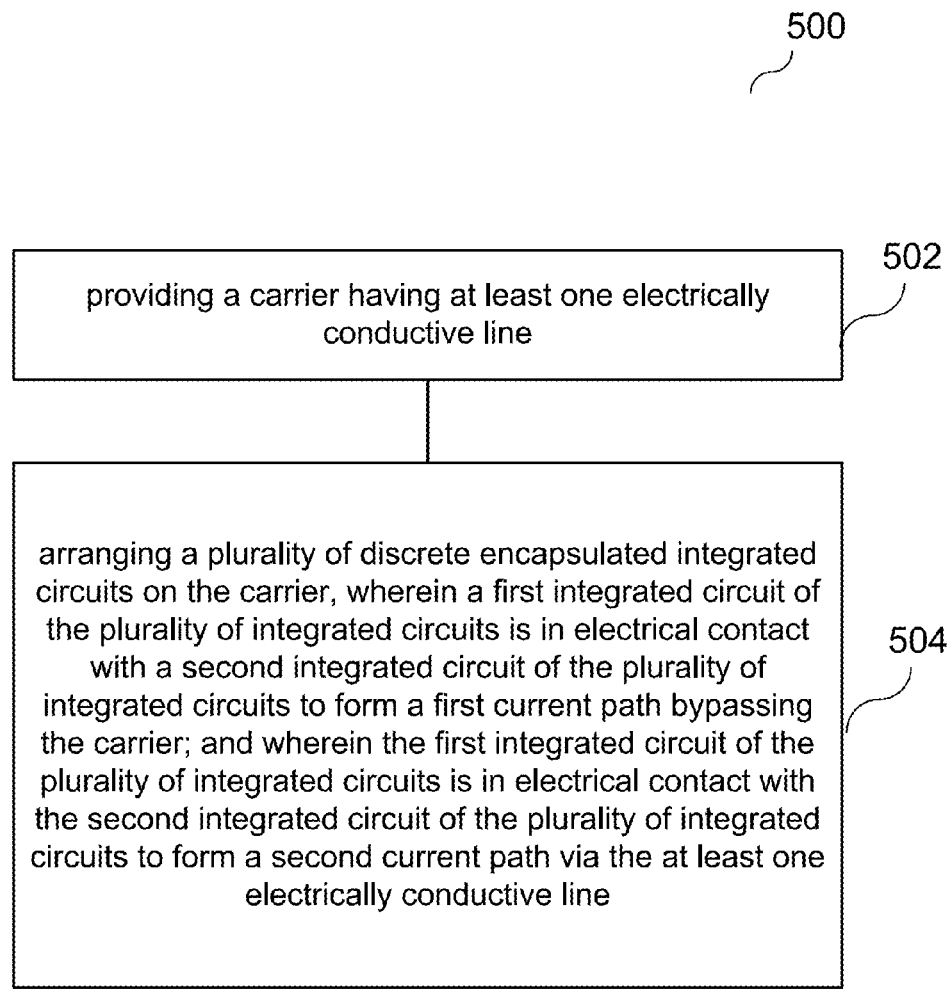
FIG. 5 shows a flowchart illustrating a method for manufacturing a circuit arrangement according to various embodiments.

FIG. 5 shows a flowchart illustrating a method for manufacturing a circuit arrangement according to various embodiments.

At 502, a carrier having at least one electrically conductive line may be provided.

At 504, a plurality of discrete encapsulated integrated circuits may be arranged on the carrier; wherein a first integrated circuit of the plurality of integrated circuits is in electrical contact with a second integrated circuit of the plurality of integrated circuits to form a first current path bypassing the carrier; and wherein the first integrated circuit of the plurality of integrated circuits is in electrical contact with the second integrated circuit of the plurality of integrated circuits to form a second current path via the at least one electrically conductive line.

In various embodiments, the carrier may be a printed circuit board. In various embodiments, the carrier may include an organic substrate, e.g., including laminate material or epoxy. In various embodiments, the carrier may include an inorganic substrate, e.g. including ceramic material.

In various embodiments, the discrete encapsulated integrated circuits may be configured as TO (Transistor Outline) integrated circuits. In various embodiments, the discrete encapsulated integrated circuits may be configured as SMD (surface-mounted-device) integrated circuits.

In various embodiments, the plurality of integrated circuits may include one or more power integrated circuits. In various embodiments, the one or more power integrated circuits may include at least one of a power integrated circuit selected from a group consisting of: power FET (field effect transistor, such as power MOSFET (Metal Oxide Semiconductor Field Effect Transistor) or JFET (Junction Gate Field Effect Transistor)); power bipolar transistor; IGBT (Insulated Gate Bipolar Transistor); and thyristor. In various embodiments, the one or more power integrated circuits may include a power FET integrated with additional logic and/or sensor components using BCD (Bipolar-CMOS-DMOS) technology or CD (CMOS-DMOS) technology.

According to various embodiments, the first current path may be electrically insulated from the second current path.

According to various embodiments, the plurality of integrated circuits may be configured to provide the first current path to be capable of carrying a first current being higher than a second current flowing through the second current path. In various embodiments, the plurality of integrated circuits may be configured to provide the first current path to be capable of carrying a load current (e.g. higher than 10 A) and the second current path to be capable of carrying a control current (e.g. lower than 1 A).

In various embodiments, the plurality of integrated circuits may be configured to provide the first current path to be capable of carrying the first current being in the range from about 10 A to about 1000 A, e.g. in the range from about 20 A to about 900 A, e.g. in the range from about 50 A to about 800 A, e.g. in the range from about 80 A to about 600 A, e.g. in the range from about 100 A to 400 A, e.g. in the range from about 200 A to 300 A. The plurality of integrated circuits may be configured to provide the second current path to be capable of carrying the second current being in the range from about 5 mA to about 5 A, e.g. in the range from about 10 mA to about 4 A, e.g. in the range from about 50 mA to about 3 A, e.g. in the range from about 100 mA to about 2 A, e.g. in the range from about 500 mA to about 1 A.

According to various embodiments, the plurality of integrated circuits may include at least one normally-on device, e.g. a depletion MOS transistor. The plurality of integrated circuits may include at least one normally-off device, e.g. an enhancement MOS transistor. The normally-off device may be a discrete encapsulated device.

According to various embodiments, the method may further include thermally coupling a cooling structure to at least one of the integrated circuits. In various embodiments, the method may include mechanically coupling the cooling structure to the plurality of integrated circuits. The cooling structure may be mechanically coupled to the plurality of integrated circuits by means of one of the following: clamping structure; screw; soldering; glueing; welding.

In various embodiments, the method may further include arranging at least one further discrete encapsulated integrated circuit at a distance to the plurality of integrated circuits and electrically coupling the at least one further discrete encapsulated integrated circuit to the plurality of integrated circuits via the carrier. The at least one further discrete encapsulated integrated circuit may include a logic circuit, a sensor circuit, or a power transistor.

Figure 6:
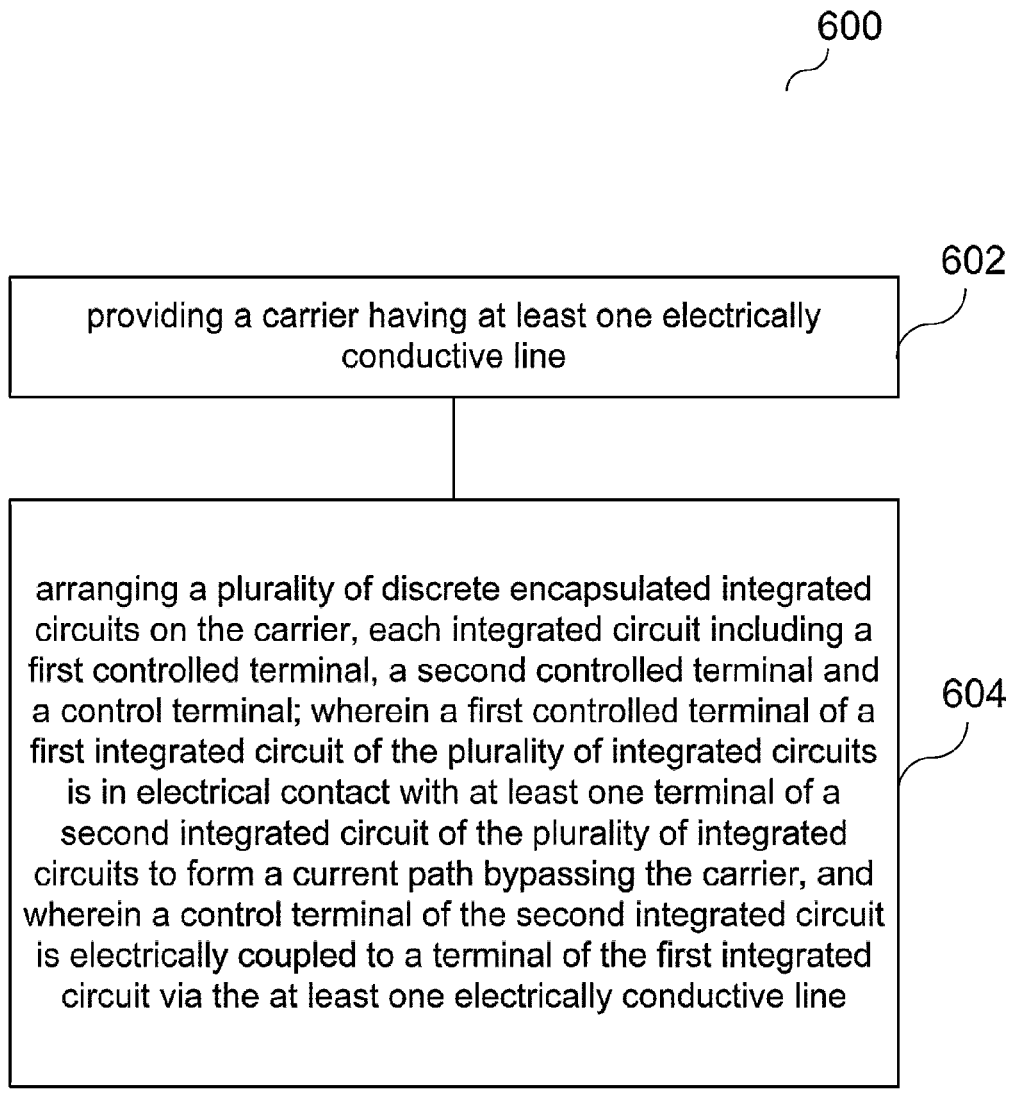
FIG. 6 shows a flowchart illustrating a method for manufacturing a circuit arrangement according to various embodiments.

FIG. 6 shows a flowchart illustrating a method for manufacturing a circuit arrangement according to various embodiments.

At 602, a carrier having at least one electrically conductive line may be provided.

At 604, a plurality of discrete encapsulated integrated circuits may be arranged on the carrier. Each integrated circuit may include a first controlled terminal, a second controlled terminal and a control terminal. A first controlled terminal of a first integrated circuit of the plurality of integrated circuits may be in electrical contact with at least one terminal of a second integrated circuit of the plurality of integrated circuits to form a current path bypassing the carrier. A control terminal of the second integrated circuit may be electrically coupled to a terminal of the first integrated circuit via the at least one electrically conductive line.

In various embodiments, a first controlled terminal of each integrated circuit may be arranged on a first side of the integrated circuit, and a second controlled terminal of each integrated circuit may be arranged on a second side of the integrated circuit, wherein the second side is opposite the first side.

In various embodiments, the first controlled terminal of the first integrated circuit may be of the same terminal type as the at least one terminal of the second integrated circuit. In various embodiments, the first controlled terminal of the first integrated circuit and the at least one terminal of the second integrated circuit may be drain terminals of field effect transistors, e.g. to form a bi-directional switch for blocking in both directions.

In various embodiments, the first controlled terminal of the first integrated circuit may be of a different terminal type as the at least one terminal of the second integrated circuit. In various embodiments, the first controlled terminal of the first integrated circuit may be a drain terminal of a field effect transistor and the at least one terminal of the second integrated circuit may be a source terminal of a field effect transistor, e.g. to form a cascade circuit or a half-bridge circuit.

Various embodiments described with respect to the circuit arrangement 100, 200, 300 above are analogously valid for the method of manufacturing the circuit arrangement of FIG. 5 and FIG. 6.

Figure 7A:
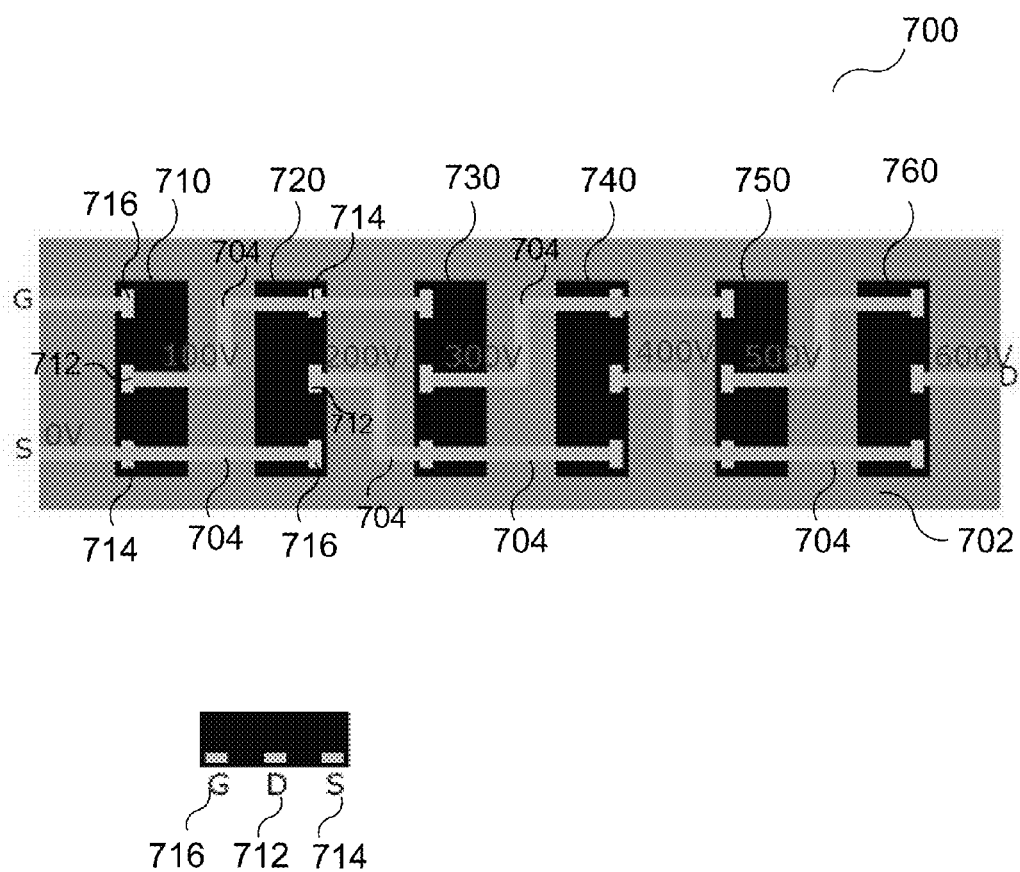
FIG. 7A shows a bottom view of a circuit arrangement according to various embodiments.
Figure 7B:
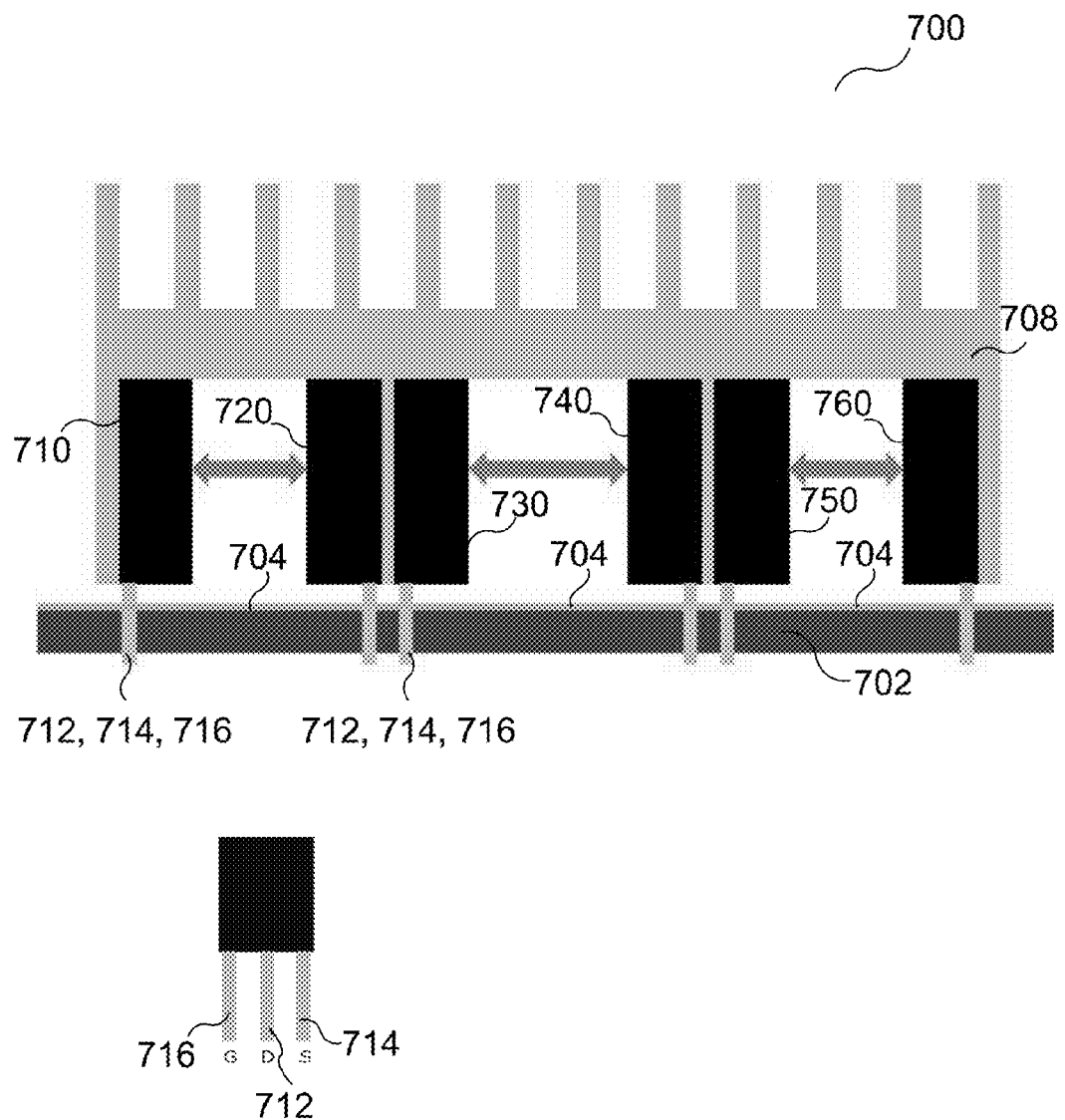
FIG. 7B shows a side view of the circuit arrangement according to various embodiments.

FIG. 7A shows a bottom view of a circuit arrangement 700 according to various embodiments, and FIG. 7B shows a side view of the circuit arrangement 700 according to various embodiments.

Similar to the circuit arrangement 300 described above, the circuit arrangement 700 may include a carrier 702 having at least one electrically conductive line 704; and a plurality of discrete encapsulated integrated circuits 710, 720, 730, 740, 750, 760 arranged on the carrier 702.

In various embodiments of FIGS. 7A and 7B, each integrated circuit 710-760 may include a first controlled terminal 712, a second controlled terminal 714 and a control terminal 716. For illustrative purpose, the plurality of integrated circuits 710-760 are shown to be power FETs, e.g. power MOSFETs, wherein the first controlled terminal 712 may be a drain terminal (D), the second controlled terminal 714 may be a source terminal (S) and the control terminal 716 may be a gate terminal (G). It is understood that the plurality of integrated circuits 710-760 may be other types of power integrated circuits, and the respective terminals of the integrated circuits and the electrical contact/coupling there between described below may be adapted accordingly.

In various embodiments, the drain terminal 712 of the first integrated circuit 710 may be in electrical contact with the source terminal 714 of the second integrated circuit 720 via the at least one electrically conductive line 704 of the carrier 702.

The gate terminal 716 of the second integrated circuit 720 may be electrically coupled to the source terminal 714 of the first integrated circuit 710 via the at least one electrically conductive line 704 of the carrier 702.

In FIG. 7A, a bottom view of the discrete encapsulated integrated circuits 710-760 is shown, each of which includes the first controlled terminal (D) 712, the second controlled terminal (S) 714 and the control terminal (G) 716. In FIG. 7B, a front view of the discrete encapsulated integrated circuits 710-760 is shown, each of which includes the drain terminal 712, the source terminal 714 and the gate terminal 716 arranged as a plurality of pins extending from the encapsulated package body (e.g. TO package, e.g. TO220-3 or TO247-3 package). The integrated circuits 710-760 may have a structure without a clip exposed at the side of the encapsulated body as in the integrated circuits 310, 320 of FIG. 3A. Accordingly, the electrical coupling between the respective terminals of the integrated circuit 710-760 may be implemented through the electrically conductive line 704 of the carrier 702.

The integrated circuits 730, 740, 750, 760 may be similarly connected among themselves and to the second integrated circuit 720 in a similar way as the electrical connection between the first integrated circuit 710 and the second integrated circuit 720. Such a circuit arrangement 700 forms the circuit 400 of FIG. 4.

As shown in FIG. 7B, the adjacent integrated circuits may be spaced apart from each other, or may be arranged next to each other having one side of each integrated circuit contacting with the cooling structure 708.

According to the embodiments of FIG. 7A and FIG. 7B, the entire redistribution of the sub modules, i.e. the respective integrated circuits, may be provided at one level, i.e. at the carrier 702. In this manner, the S-D (source-drain) power path of the circuit 400 may have to be guided through the respective pins for a few times, which may be associated with corresponding electric losses and interferences. On the other hand, the packaging technique for the circuit arrangement 700 may be simplified in the circuitry as shown in FIG. 7A and FIG. 7B, since standard packages may be used. Further, the through-contacting of a load terminal through the top side of the package may be omitted.

The "stack on carrier (e.g. PCB)" arrangement of FIG. 7A and FIG. 7B may be used as a basis for improved cooling of the individual switches. The individual packages may bring the chip on one side (as shown) into good thermal contact with the (symbolically drawn) cooling structure, wherein the chips may be electrically isolated from the cooling structure. This may e.g. be made by putting an isolation cap over each package or by designing the packages as fullpacks having a heat sink encapsulated therein, before the packages are pressed to the cooling structure, e.g. a heat conducting fin. The heat conducting fin may include a thermally well conducting but electrically isolating material. The cooling structure may be omitted and an air flow may be used, in case little power loss is converted in the individual packages.

Various embodiments are directed to a circuit arrangement. The circuit arrangement may include a carrier having at least one electrically conductive line; a plurality of discrete encapsulated integrated circuits arranged on the carrier; wherein a first integrated circuit of the plurality of integrated circuits is in electrical contact with a second integrated circuit of the plurality of integrated circuits to form a first current path bypassing the carrier; and wherein the first integrated circuit of the plurality of integrated circuits is in electrical contact with the second integrated circuit of the plurality of integrated circuits to form a second current path via the at least one electrically conductive line.

In various embodiments, the carrier may be a printed circuit board. In various embodiments, the carrier may include an organic substrate, e.g., including laminate material or epoxy. In various embodiments, the carrier may include an inorganic substrate, e.g. including ceramic material.

In various embodiments, the discrete encapsulated integrated circuits may be configured as TO (Transistor Outline) integrated circuits. In various embodiments, the discrete encapsulated integrated circuits may be configured as SMD (surface-mounted-device) integrated circuits.

In various embodiments, the plurality of integrated circuits may include one or more power integrated circuits. In various embodiments, the one or more power integrated circuits may include at least one of a power integrated circuit selected from a group consisting of: power FET (field effect transistor, such as power MOSFET (Metal Oxide Semiconductor Field Effect Transistor) or JFET (Junction Gate Field Effect Transistor)); power bipolar transistor; IGBT (Insulated Gate Bipolar Transistor); and thyristor. In various embodiments, the one or more power integrated circuits may include a power FET integrated with additional logic and/or sensor components using BCD (Bipolar-CMOS-DMOS) technology or CD (CMOS-DMOS) technology.

In various embodiments, the discrete encapsulated integrated circuit may internally have a planar structured chip in which a current may flow horizontally parallel to the main surface of the chip. In various embodiments, the discrete encapsulated integrated circuit may internally have a vertical structured chip in which a current may flow vertically through the chip from one main surface to the opposite other main surface of the chip. In other words, the current can flow in a direction perpendicular to the main surfaces of the chip. The chip having a vertical structure may have contacts on its front side and back side. By way of example, the drain contact of a power MOSFET chip may be arranged on the first side of the chip, while the gate contact and the source contact of the power MOSFET chip may be arranged on the second side of the chip so as to support a vertical current flow through the chip between the drain region over the first chip side and the source region over the second chip side. The chip may be encapsulated with encapsulation material, such as mold material (e.g. press mold material) and lamination material (e.g. polymer material with glass fibers), to form the respective discrete encapsulated integrated circuit.

In various embodiments, the discrete encapsulated integrated circuits may be individually tested, e.g. before being arranged on the carrier, so as to achieve a higher yield.

According to various embodiments, the first current path may be electrically insulated from the second current path.

According to various embodiments, the plurality of integrated circuits may be configured to provide the first current path to be capable of carrying a first current being higher than a second current flowing through the second current path. In various embodiments, the plurality of integrated circuits may be configured to provide the first current path to be capable of carrying a load current (e.g. higher than 10 A) and the second current path to be capable of carrying a control current (e.g. lower than 1 A).

In various embodiments, the plurality of integrated circuits may be configured to provide the first current path to be capable of carrying the first current being in the range from about 10 A to about 1000 A, e.g. in the range from about 20 A to about 900 A, e.g. in the range from about 50 A to about 800 A, e.g. in the range from about 80 A to about 600 A, e.g. in the range from about 100 A to 400 A, e.g. in the range from about 200 A to about 300 A. In various embodiments, the plurality of integrated circuits may be configured to provide the second current path to be capable of carrying the second current being in the range from about 5 mA to about 5 A, e.g. in the range from about 10 mA to about 4 A, e.g. in the range from about 50 mA to about 3 A, e.g. in the range from about 100 mA to about 2 A, e.g. in the range from about 500 mA to about 1 A.

According to various embodiments, the plurality of integrated circuits may include at least one normally-on device, e.g. a depletion MOS transistor. In various embodiments, the plurality of integrated circuits may include at least one normally-off device, e.g. an enhancement MOS transistor. The normally-off device may be a discrete encapsulated device.

According to various embodiments, the circuit arrangement may further include a cooling structure thermally coupled to at least one of the integrated circuits. In various embodiments, the cooling structure may be mechanically coupled to the plurality of integrated circuits. In various embodiments, the cooling structure may be mechanically coupled to the plurality of integrated circuits by means of one of the following: clamping structure; screw; soldering; glueing; welding.

In various embodiments, the circuit arrangement may further include at least one further discrete encapsulated integrated circuit being arranged at a distance to the plurality of integrated circuits and being electrically coupled to the plurality of integrated circuits via the carrier. The at least one further discrete encapsulated integrated circuit may include a logic circuit, a sensor circuit, or a power transistor.

Various embodiments are further directed to a circuit arrangement. The circuit arrangement may include a carrier having at least one electrically conductive line; a plurality of discrete encapsulated integrated circuits arranged on the carrier, wherein each integrated circuit includes a first controlled terminal, a second controlled terminal and a control terminal. A first controlled terminal of a first integrated circuit of the plurality of integrated circuits may be in electrical contact with at least one terminal of a second integrated circuit of the plurality of integrated circuits to form a current path bypassing the carrier. A control terminal of the second integrated circuit may be electrically coupled to a terminal of the first integrated circuit via the at least one electrically conductive line.

In various embodiments, a first controlled terminal of each integrated circuit may be arranged on a first side of the integrated circuit, and a second controlled terminal of each integrated circuit may be arranged on a second side of the integrated circuit, wherein the second side is opposite the first side.

In various embodiments, the first controlled terminal of the first integrated circuit may be of the same terminal type as the at least one terminal of the second integrated circuit. In various embodiments, the first controlled terminal of the first integrated circuit and the at least one terminal of the second integrated circuit may be drain terminals of field effect transistors, e.g. to form a bi-directional switch for blocking in both directions.

In various embodiments, the first controlled terminal of the first integrated circuit may be of a different terminal type as the at least one terminal of the second integrated circuit. In various embodiments, the first controlled terminal of the first integrated circuit may be a drain terminal of a field effect transistor and the at least one terminal of the second integrated circuit may be a source terminal of a field effect transistor, e.g. to form a cascade circuit or a half-bridge circuit.

Various embodiments are further directed to a method for manufacturing a circuit arrangement. The method may include providing a carrier having at least one electrically conductive line; arranging a plurality of discrete encapsulated integrated circuits on the carrier; wherein a first integrated circuit of the plurality of integrated circuits is in electrical contact with a second integrated circuit of the plurality of integrated circuits to form a first current path bypassing the carrier; and wherein the first integrated circuit of the plurality of integrated circuits is in electrical contact with the second integrated circuit of the plurality of integrated circuits to form a second current path via the at least one electrically conductive line.

In various embodiments, the discrete encapsulated integrated circuits may be individually tested, e.g. before being arranged on the carrier, so as to achieve a higher yield.

According to various embodiments, the method may further include thermally coupling a cooling structure to at least one of the integrated circuits. In various embodiments, the method may include mechanically coupling the cooling structure to the plurality of integrated circuits. In various embodiments, the cooling structure may be mechanically coupled to the plurality of integrated circuits by means of one of the following: clamping structure; screw; soldering; glueing; welding.

In various embodiments, the method may further include arranging at least one further discrete encapsulated integrated circuit at a distance to the plurality of integrated circuits and electrically coupling the at least one further discrete encapsulated integrated circuit to the plurality of integrated circuits via the carrier. The at least one further discrete encapsulated integrated circuit may include a logic circuit, a sensor circuit, or a power transistor.

Various embodiments are further directed to a method for manufacturing a circuit arrangement. The method may include providing a carrier having at least one electrically conductive line; arranging a plurality of discrete encapsulated integrated circuits on the carrier, wherein each integrated circuit includes a first controlled terminal, a second controlled terminal and a control terminal. A first controlled terminal of a first integrated circuit of the plurality of integrated circuits may be in electrical contact with at least one terminal of a second integrated circuit of the plurality of integrated circuits to form a current path bypassing the carrier. A control terminal of the second integrated circuit may be electrically coupled to a terminal of the first integrated circuit via the at least one electrically conductive line.

Various embodiments described with regard to the circuit arrangement above are analogously valid for the method of manufacturing the circuit arrangement, and vice versa.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:
1. A circuit arrangement, comprising:
   a carrier comprising at least one electrically conductive line;

a plurality of discrete encapsulated integrated circuits arranged on the carrier;

wherein a first integrated circuit of the plurality of integrated circuits is in electrical contact with a second integrated circuit of the plurality of integrated circuits to form a first current path bypassing the carrier; and wherein the first integrated circuit of the plurality of integrated circuits is in electrical contact with the second integrated circuit of the plurality of integrated circuits to form a second current path via the at least one electrically conductive line.

2. The circuit arrangement of claim 1,
wherein the carrier is a printed circuit board.

3. The circuit arrangement of claim 1,
wherein the carrier comprises one of a laminate substrate, an epoxy substrate, and a ceramic substrate.

4. The circuit arrangement of claim 1,
wherein the discrete encapsulated integrated circuits are configured as one of TO integrated circuits and SMD integrated circuits.

5. The circuit arrangement of claim 1,
wherein the first current path is electrically insulated from the second current path.

6. The circuit arrangement of claim 1,
wherein the plurality of integrated circuits comprises one or more power integrated circuits.

7. The circuit arrangement of claim 1,
wherein the first current path is configured to carry a first current higher than a second current configured to flow through the second current path.

8. The circuit arrangement of claim 7,
wherein the first current path is configured to carry a load current and the second current path is configured to carry a control current.

9. The circuit arrangement of claim 7,
wherein the first current path is configured to carry the first current in a range from about 10 A to about 1000 A.

10. The circuit arrangement of claim 7,
wherein the second current path is configured to carry the second current in a range from about 5 mA to about 5 A.

11. The circuit arrangement of claim 1, further comprising:
a cooling structure thermally coupled to at least one of the integrated circuits.

12. The circuit arrangement of claim 11,
wherein the cooling structure is mechanically coupled to the plurality of integrated circuits.

13. The circuit arrangement of claim 1,
wherein the plurality of integrated circuits comprises at least one of at least one normally-on device and at least one normally-off device.

14. The circuit arrangement of claim 1, further comprising:
at least one further discrete encapsulated integrated circuit being arranged at a minimum predefined distance to the plurality of integrated circuits and is electrically coupled to the plurality of integrated circuits via the carrier.

15. A circuit arrangement, comprising:
a carrier comprising at least one electrically conductive line;
a plurality of discrete encapsulated integrated circuits arranged on the carrier,
wherein each integrated circuit comprises:
 a first controlled terminal;
 a second controlled terminal; and
 a control terminal;
wherein a first controlled terminal of a first integrated circuit of the plurality of integrated circuits is in electrical contact with at least one terminal of a second integrated circuit of the plurality of integrated circuits to form a current path bypassing the carrier;
wherein an electrically contacted surface of the first controlled terminal of the first integrated circuit and an electrically contacted surface of the at least one terminal of the second integrated circuit face each other; and
wherein a control terminal of the second integrated circuit is electrically coupled to a terminal of the first integrated circuit via the at least one electrically conductive line.

16. The circuit arrangement of claim 15,
wherein a first controlled terminal of each integrated circuit is arranged on a first side of the integrated circuit;
wherein a second controlled terminal of each integrated circuit is arranged on a second side of the integrated circuit, wherein the second side is opposite the first side.

17. The circuit arrangement of claim 16,
wherein the first controlled terminal of the first integrated circuit is of the same terminal type as the at least one terminal of the second integrated circuit.

18. The circuit arrangement of claim 17,
wherein the first controlled terminal of the first integrated circuit and the at least one terminal of the second integrated circuit are drain terminals.

19. The circuit arrangement of claim 16,
wherein the first controlled terminal of the first integrated circuit is of a different terminal type as the at least one terminal of the second integrated circuit.

20. A method for manufacturing a circuit arrangement, the method comprising:
providing a carrier comprising at least one electrically conductive line;
arranging a plurality of discrete encapsulated integrated circuits on the carrier;
wherein a first integrated circuit of the plurality of integrated circuits is in electrical contact with a second integrated circuit of the plurality of integrated circuits to form a first current path bypassing the carrier; and
wherein the first integrated circuit of the plurality of integrated circuits is in electrical contact with the second integrated circuit of the plurality of integrated circuits to form a second current path via the at least one electrically conductive line.

21. The method of claim 20,
wherein the plurality of integrated circuits comprises one or more power integrated circuits.

22. The method of claim 20,
wherein the first current path is configured to carry a first current higher than a second current configured to flow through the second current path.

* * * * *